United States Patent
Yamada

[11] Patent Number: 5,371,697
[45] Date of Patent: Dec. 6, 1994

[54] ASSOCIATIVE MEMORY DEVICE EQUIPPED WITH ASSOCIATIVE MEMORY CELLS IMPLEMENTED BY PAIRS OF ELECTRICALLY ERASABLE AND PROGRAMMABLE MEMORY TRANSISTORS

[75] Inventor: Hachiro Yamada, Tokyo, Japan
[73] Assignee: NEC Corporation, Tokyo, Japan
[21] Appl. No.: 84,627
[22] Filed: Jun. 30, 1993

[30] Foreign Application Priority Data

Jun. 30, 1992 [JP] Japan .................... 4-172247

[51] Int. Cl.$^5$ .......................... G11C 15/00
[52] U.S. Cl. .................... 365/49; 365/185; 365/230.06
[58] Field of Search ............ 365/230.06, 185, 49

[56] References Cited

U.S. PATENT DOCUMENTS

| | | | |
|---|---|---|---|
| 4,538,243 | 8/1985 | Zehner | 365/49 |
| 5,051,948 | 9/1991 | Watabe et al. | 365/49 |
| 5,077,691 | 12/1991 | Haddad et al. | 365/218 |

OTHER PUBLICATIONS

H. Kadota et al., "An 8-kbit Content-Addressable and Reentrant Memory", IEEE Journal of Solid-State Circuits, vol. SC-20, No. 5, Oct. 1985, pp. 951-957.

Primary Examiner—Eugene R. LaRoche
Assistant Examiner—Christopher R. Glembocki
Attorney, Agent, or Firm—Sughrue, Mion, Zinn, Macpeak & Seas

[57] ABSTRACT

An associative memory device has associative memory cells arranged in matrix and each implemented by a parallel combination of two electrically erasable and programmable non-volatile memory transistors, and a multi-bit data code stored in a row of associative memory cells allows the two electrically erasable and programmable non-volatile memory transistors of each associative memory cell to selectively enter the programmed state so that a multi-bit key code is checked to see whether or not drain current flows through the electrically erasable and programmable non-volatile memory transistors into a source line.

11 Claims, 4 Drawing Sheets

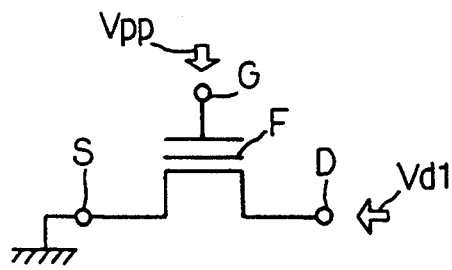
Fig. 3A
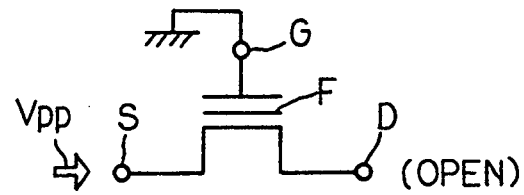
Fig. 3B
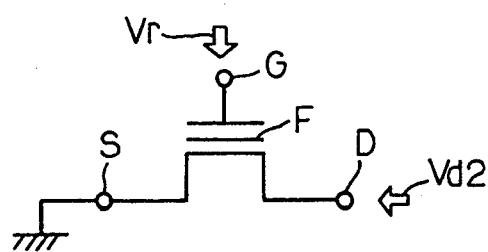
Fig. 3C
| KEY DATA BIT | | | Logic "0" | | Logic "1" | |
|---|---|---|---|---|---|---|
| DRAIN (volt) | | | 1 | 0 | 0 | 1 |
| STORED DATA BIT | Logic "0" | STATE | OFF | ON | OFF | ON |
| | | DRAIN CURRENT | No | No | No | Yes |
| | Logic "1" | STATE | ON | OFF | ON | OFF |
| | | DRAIN CURRENT | Yes | No | No | No |
| | | | TM1 | TM2 | TM1 | TM2 |
Fig. 4

ASSOCIATIVE MEMORY DEVICE EQUIPPED WITH ASSOCIATIVE MEMORY CELLS IMPLEMENTED BY PAIRS OF ELECTRICALLY ERASABLE AND PROGRAMMABLE MEMORY TRANSISTORS

FIELD OF THE INVENTION

This invention relates to an associative memory device for data retrieval and, more particularly, to an associative memory device with electrically erasable and programmable memory cells.

DESCRIPTION OF THE RELATED ART

A typical example of the associative memory device is disclosed by Kadota et al in "An 8-kbit Content-Addressable and Reentrant Memory", IEEE JOURNAL OF SOLID STATE CIRCUITS, vol. SC-20, No. 5, October 1985, and another associative memory is disclosed in U.S. Pat. No. 4,538,243. These prior art associative memory devices have associative memory cells each accompanied with a coincidence circuit.

FIG. 1 illustrates a typical example of the associative memory cell, and largely comprises a static type random access memory cell 1 and a coincidence circuit 2. The static type random access memory cell 1 comprises a series combination of a p-channel enhancement type switching transistor Qp1 and an n-channel enhancement type switching transistor Qn2 coupled between high and low power voltage lines, another series combination of a p-channel enhancement type switching transistor Qp3 also coupled between the high and low power voltage lines, and two n-channel enhancement type switching transistors Qn5 and Qn6 coupled between the common drain nodes Dn1 and Dn2 and a pair of bit lines BL1 and BL2. The common drain nodes Dn1 and Dn2 are coupled with the gate electrodes of the switching transistors Qp3 and Qn4 and the gate electrodes of the switching transistors Qp1 and Qn2 so as to form a flip flop circuit, and a word line WL is coupled with the gate electrodes of the n-channel enhancement type switching transistors Qn5 and Qn6 for coupling the common drain nodes Dn1 and Dn2 with the pair of bit lines BL1 and BL2. A data bit is supplied to the pair of bit lines BL1 and BL2 in the form of potential difference, and the word line WL at active high voltage level allows the n-channel enhancement type switching transistors Qn5 and Qn6 to transfer the potential difference to the common drain nodes Dn1 and Dn2. Then, the potential difference reach the common drain nodes Dn1 and Dn2, and the two series combinations keep the potential difference between the common drain nodes Dn1 and Dn2.

The coincidence circuit 2 is implemented by two series combinations of n-channel enhancement type switching transistors Qn7, QnS, Qn9 and Qn10 coupled in parallel between a detecting line ED and the low power voltage line. The gate electrodes of the n-channel enhancement type switching transistors Qn7 and Qn9 are coupled with the common drain nodes Dn2 and Dn1, respectively, and the n-channel enhancement type switching transistors Qn8 and Qn10 are respectively gated by the bit lines BL1 and BL2.

The coincidence circuit 2 thus arranged behaves as follows. Assuming now that the stored data bit is represented by the high voltage level at the common drain node Dn1 and the low voltage level at the other common drain node Dn2, the n-channel enhancement type switching transistor Qn9 is turned on, and the n-channel enhancement type switching transistor Qn7 is turned off. If a data bit is represented by the high voltage level on the bit line BL1 and the low voltage level on the other bit line BL2, the n-channel enhancement type switching transistor Qn8 turns on, and the n-channel enhancement type switching transistor Qn10 remains off. As a result, any current path is not provided from the detecting line ED to the low power voltage line, and the detecting line ED is kept at the high voltage level indicative of inconsistence between the data bit stored in the static type random access memory cell 1 and the data bit on the bit lines BL1 and BL2. On the other hand, if a data bit is represented by the low voltage level on the bit line BL1 and the high voltage level on the bit line BL2, the n-channel enhancement type switching transistor Qn10 turns on, and the n-channel enhancement type switching transistor Qn8 is turned off. Then, a current path is established from the detecting line ED through the n-channel enhancement type switching transistors Qn9 and Qn10 to the low power voltage line, and the low voltage level on the detecting line ED is indicative of consistence between the data bit stored in the memory cell 1 and the data bit on the bit lines BL1 and BL2.

Thus, the prior art associative memory cell is fabricated from ten field effect transistors, and the coincidence circuit 2 can produce the detecting signal merely indicative of consistence or inconsistence between the data bits. This results in the following problems inherent in the prior art associative memory device.

The first problem is small memory capacity. In order to construct a memory cell array by using the prior art associative memory cell, the static type random access memory cells 1 are arranged in matrix, and are respectively accompanied with the coincidence circuits 2. As described hereinbefore, each associative memory cell is fabricated from ten field effect transistors, and, accordingly, occupies a large amount of real estate. For this reason, only a small number of associative memory cells are integrated on a semiconductor chip.

Another problem is the detecting signal merely indicative of consistence or inconsistence. If the associative memory device is expected to store variable-length data, the stored data are not always equal in length to a key data, and some detecting signals indicative of inconsistence may be nonsense. Therefore, the prior art associative memory device is only applicable as a data storage for fixed-length data, and can not be applied to a pattern matching and a comparing system for character strings, by way of example.

Yet another problem is volatile memory. The prior art associative memory cell stores a data bit in the form of potential difference, and the stored data are lost upon switching off.

SUMMARY OF THE INVENTION

It is therefore an important object of the present invention to provide an associative memory device which is free from the problems inherent in the prior art associative memory device.

To accomplish the object, the present invention proposes to form a memory cell array by using pairs of electrically erasable and programmable non-volatile memory transistors.

In accordance with the present invention, there is provided an associative memory device selectively entering an erasing mode, a register mode and a retrieval mode of operation, comprising: a) a plurality of memory cells arranged in rows and columns, and each having a first electrically erasable and programmable non-volatile memory transistor and a second electrically erasable and programmable non-volatile memory transistor arranged in parallel, the first and second electrically erasable and programmable non-volatile memory transistors entering an erased state with one of high and low thresholds and a programmed state with the other of the high and low thresholds; b) a plurality of word lines respectively associated with the rows of memory cells, and each coupled with control gate electrodes of the first and second electrically erasable and programmable non-volatile memory transistors of the associated row; c) a word line driving unit coupled with the plurality of word lines, and selectively driving the plurality of word lines to a first programming level in the register mode, to a first erasing level in the erasing mode and to a first read-out level in the retrieval mode; d) a plurality of bit line pairs each consisting of a first bit line and a second bit line, and respectively associated with the columns of memory cells, the first bit line of each bit line pair being coupled with drain nodes of the first electrically erasable and programmable non-volatile memory transistors of the associated column, the second bit line of each bit line pair being coupled with drain nodes of the second electrically erasable and programmable non-volatile memory transistors of the associated column; e) a bit line driving unit responsive to a multi-bit data signal indicative of a data code in the register mode and of a key code in the retrieval mode, and operative to selectively drive the first and second bit lines of the plurality of bit line pairs to a second programming level depending upon the logic level of bits of the data code in the register mode and to a second read-out level depending upon the logic level of bits of the key code in the retrieval mode, the bit line driving unit further being operative to allow the plurality of bit line pairs to enter open-state in the erasing mode; f) a source line system coupled with source nodes of the first and second electrically erasable and programmable non-volatile memory transistors of the plurality of memory cells; g) an source line driving unit coupled with the source line system for supplying a third programming level in the register mode, a third erasing level in the erasing mode and a third read-out level in the retrieval mode to the source line system, the word line driving unit cooperating with the bit line driving unit and the source line driving unit for causing one of the first and second electrically erasable and programmable non-volatile memory transistors of each memory cell in one of the rows selected by the word line driving unit to enter the programmed state depending upon the logic level of one of the bits of the data code in the register mode, the word line driving unit further cooperating with the bit line driving unit and the source line driving unit for checking the memory cells of one of the rows selected by the word line driving unit to see whether or not the first and second electrically erasable and programmable non-volatile memory cells thereof allow drain current to flow into the source line system; and h) a monitoring unit for monitoring the source line system to see whether or not the drain current flows, the drain current being indicative of one of consistence and inconsistence between the data code and the key code.

BRIEF DESCRIPTION OF THE DRAWINGS

The features and advantages of the associative memory device according to the present invention will be more clearly understood from the following description taken in conjunction with the accompanying drawings in which:

FIGS. 3A to 3C are diagrams showing a floating gate type field effect transistor in a programming mode, an erasing mode and a read-out mode;

FIG. 4 is a chart showing relation between a stored data code and a key code.

DESCRIPTION OF THE PREFERRED EMBODIMENTS

First Embodiment

Figure 1:
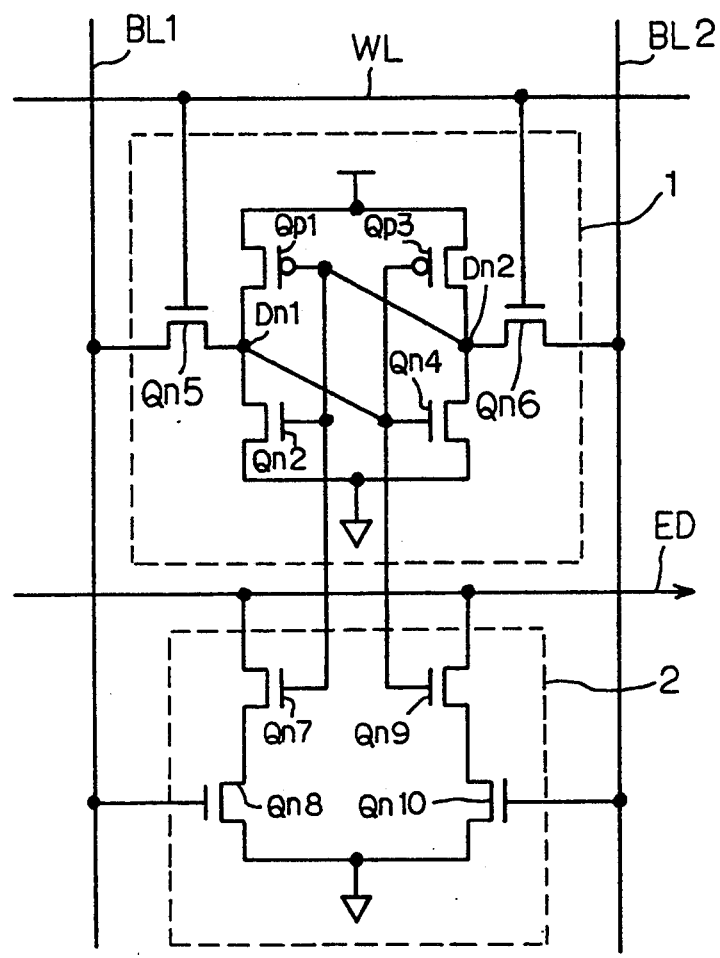
FIG. 1 is a circuit diagram showing the arrangement of the prior art associative memory cell.
Figure 2:
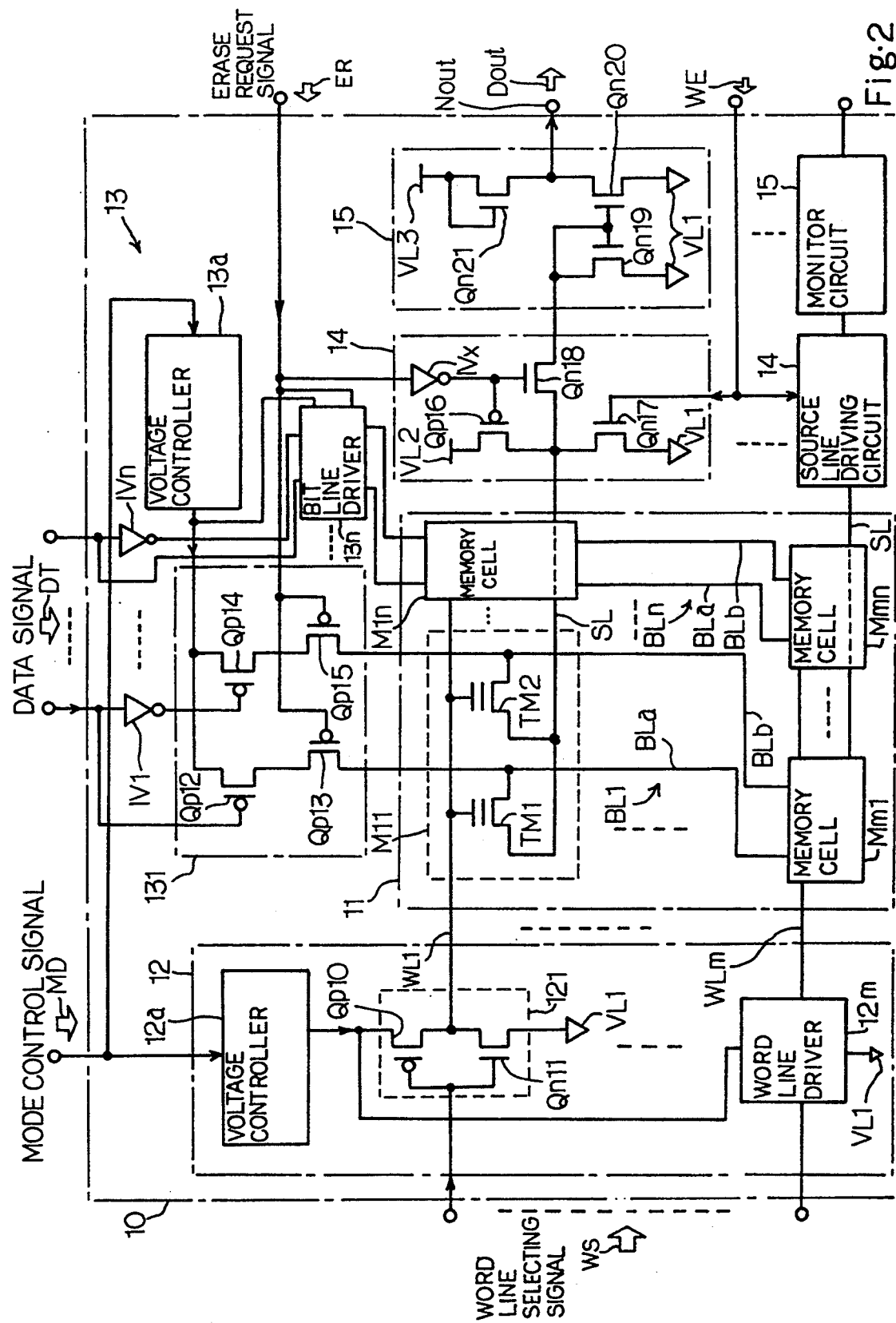
FIG. 2 is a circuit diagram showing the arrangement of an associative memory device according to the present invention.

Referring to FIG. 2 of the drawings, an associative memory device embodying the present invention is fabricated on a semiconductor chip 10, and largely comprises a memory cell array 11, a plurality of word lines WL1 to WLm, a plurality of bit line pairs BL1 to BLn, a plurality of common source lines SL, a word line driver unit 12, a bit line driving unit 13, a plurality of source line driving circuits 14 and a plurality of monitor circuits 15 for the common source line SL. The associative memory device is responsive to a mode control signal MD, and selectively enters a register mode, a retrieval mode and an erasing mode. A word line selecting signal WS, a data signal DT, an erase request signal ER and a write enable signal WE are further supplied to the associative memory device, and the associative memory device produces an output signal Dour in the retrieval mode. The word line selecting signal WS is supplied in every mode, and is indicative of one of the word lines WL1 to WLm. The data signal DT represents either data or key code. Namely, the data signal DT is indicative of the data code in the register mode, and the data code is stored in the memory cell array 11. However, while the associative memory device remains in the retrieval mode, the data signal DT is indicative of a key code, and the key code is compared with the data code stored in the memory cell array 11. The erase request signal ER is switched between an active high voltage level in the erasing mode, and remains in an inactive low voltage level in the other modes. While the associative memory device is in the register mode, the write enable signal WE is switched to active high voltage level. However, the write enable signal WE remains in inactive low voltage level in the erasing and retrieval modes.

The memory cell array 11 consists of a plurality of associative memory cells M11, ..., M1n, ..., Mm1, ... and Mmn arranged in m rows and n columns, and each of the associative memory cells M11 to Mmn is implemented by a pair of floating gate type field effect transistors TM1 and TM2. The word lines WL1 to WLm are respectively associated with the rows of associative memory cells M11 to Mmn, and are coupled with the control gate electrodes of the floating gate type field effect transistors TM1 and TM2 of the associated rows. The common source lines SL are associated with the rows of memory cells M11 to Mmn, respectively, and are coupled with the source nodes of the associated floating gate type field effect transistors TM1 and TM2. The bit line pairs BL1 to BLn are respectively associated with the columns of memory cells M11 to Mmn, and are coupled with the drain nodes of the floating gate type field effect transistors TM1 and TM2 of the associated columns.

The floating gate type field effect transistors TM1 and TM2 are of an electrically erasable and programmable type disclosed in, for example, Technical Study Report of Electronic Information Communication Society, ICD91-134. The floating gate type field effect transistor is increased in threshold level in a programming mode, and is decreased in threshold level in an erasing mode. The floating gate type field effect transistor is checked in a read-out mode to see whether the threshold level is high or low.

In detail, if an extremely high voltage level Vpp at 12 volts, the ground voltage and a positive high voltage level Vd1 at 6 volts are respectively applied to the control gate electrode G, the source node S and the drain node D of the floating gate type field effect transistor as shown in FIG. 3A, the floating gate type field effect transistor is in the programming mode, and hot electrons produced at the p-n junction between the drain and the channel are injected into the floating gate electrode F for increasing the threshold level over 5 volts.

While the ground voltage level and the extremely high voltage level Vpp are applied to the control gate electrode G and the source node S and the drain node D is opened as shown in FIG. 3B, the floating gate type field effect transistor is in the erasing mode, and the electrons are evacuated from the floating gate electrode F to the source node S for decreasing the threshold level below 5 volts.

In the read-out mode, a positive high voltage level Vg at 5 volts, the ground voltage level and a positive low voltage level at 1 volt are applied to the control gate electrode G, the source node S and the drain node D, respectively. If the floating gate type field effect transistor has the high threshold indicative of the programmed state or a data bit of logic "0" level, any conductive channel does not take place between the source node S and the drain node D, and no drain current flows. On the other hand, if the threshold is low indicative of the erased state or a data bit of logic "1" level, drain current flows from the drain node through a conductive channel to the source node S. Thus, the threshold level or the stored data bit is detectable as the drain current. In this instance, the register mode, the retrieval mode and the erasing mode are corresponding to the programming mode, the read-out mode and the erasing mode of the floating gate type field effect transistor, respectively.

Turning back to FIG. 2, the word line driver unit 12 comprises a voltage controller 12a and a plurality of word line drivers 121 to 12m respectively associated with the word lines WL1 to WLm, and the voltage controller 12a is responsive to the mode control signal MD for selectively producing the extremely high voltage level Vpp and the positive high voltage Vg. The voltage controller 12a boosts the voltage to 12 volts in the register mode, and keeps the voltage level at 5 volts in the retrieval mode. As will be described hereinbelow, while the associative memory device is in the erasing mode, the word line drivers 121 to 12m keep the word lines WL1 to WLm at the ground voltage level regardless of the output voltage level of the voltage controller 12a, and all of the memory cells M11 to Mmn are concurrently erased.

Each of the word line drivers 121 to 12m is implemented by a series combination of a p-channel enhancement type switching transistor Qp10 and an n-channel enhancement type switching transistor Qn11 coupled between the voltage controller 12a and a power voltage line VL1, and a bit of word line selecting signal WS is applied to the gate electrodes of the switching transistors Qp10 and Qn11 of each of the word line drivers 121 to 12m. The common drain node of the switching transistors Qp10 and Qn11 of each word line driver is coupled with one of the word lines WL1 to WLm, and the p-channel enhancement type switching transistor Qp10 and the n-channel enhancement type switching transistor Qn11 complementarily turn on and off depending upon the logic level of the bit applied thereto. The word line selecting signal WS selects one of the word lines WL1 to WLm, and the corresponding bit causes the p-channel enhancement type switching transistor Qp10 of the associated word line driver to turn on so that the selected word line is coupled with the voltage controller 12a in the register and retrieval modes. However, the other word line drivers keep the non-selected word lines at ground voltage level through the n-channel enhancement type switching transistors Qn11 in the register and retrieval modes, and the n-channel enhancement type switching transistors Qn11 of all the word line drivers 121 to 12m supply the ground voltage level from the power voltage line VL1 to the word lines WL1 to WLm.

The bit line driving unit 13 comprises a voltage controller 13a, a plurality of bit line drivers 131 to 13n and a plurality of inverters IV1 to IVn. The voltage controller 13a is also responsive to the mode control signal MD for selectively producing the positive high voltage level Vd1 and the positive low voltage level Vd2. While the mode control signal MD is indicative of the register mode, the voltage controller 13a lifts the output voltage thereof to 6 volts. However, the voltage controller 13a keeps the output voltage thereof at I volt in the retrieval mode. As will be described hereinbelow, the bit line drivers 131 to 13n allow the bit line pairs BL1 to BLn to be in open-state regardless of the output voltage of the voltage controller 13a.

The bit line drivers 131 to 13n are similar in circuit arrangement to one another, and are associated with the bit line pairs BL1 to BLn, respectively. Each of the bit line drivers 131 to 13n comprises two series combinations of p-channel enhancement type switching transistors Qp12/ Qp13 and Qp14/ Qp15 coupled between the voltage controller 13a and the associated pair of bit lines BLa and BLb. One of the bits of the data signal DT is directly applied to the gate electrode of the p-channel enhancement type switching transistor Qp12, and one of the inverters IV1 to IVn supplies the complementary bit to the gate electrode of the p-channel enhancement type switching transistor Qp14. The erase request signal ER is supplied to both gate electrodes of the p-channel enhancement type switching transistors Qp13 and Qp15, and is switched to active high voltage level in the erasing mode. However, the erase request signal ER is kept at inactive low voltage level in both register and retrieval modes.

While the associative memory device is in the register mode, the voltage controller 13a supplies the positive high voltage level Vd1 to the source nodes of the p-channel enhancement type switching transistors Qp12 and Qp14, and the erase request signal ER of the inactive low voltage level allows the p-channel enhancement type switching transistors Qp13 and Qp15 to turn on. Then, each bit of the data signal DT causes one of the p-channel enhancement type switching transistors Qp12 and Qp14 to turn on depending upon the logic level thereof, and the positive high voltage level Vd1 is applied through either bit line BLa or BLb to the floating gate type field effect transistor TM1 or TM2. If a bit of the data signal DT is logic "1" level corresponding to the positive high voltage level, the p-channel enhancement type switching transistor Qp14 turns on, and the floating gate type field effect transistor TM2 enters the programming state represented by the high threshold. However, the other floating gate type field effect transistor TM1 is left in the erased state represented by the low threshold. On the other hand, a bit of logic "0" level causes the p-channel enhancement type switching transistor Qp12 to turn on, and the floating gate type field effect transistor TM1 enters the programmed state. However, the other floating gate type field effect transistor TM2 remains in the erased state. Thus, either floating gate type field effect transistor TM1 or TM2 of each memory cell enters the programmed state in the register mode.

In the erasing mode, the erase request signal ER of the active high voltage level keeps all of the p-channel enhancement type switching transistors Qp13 and Qp15 off, and all of the bit lines BLa an BLb enters the open-state.

Finally, while the associative memory device is in the retrieval mode, the voltage controller 13a produces the positive low voltage level Vd2, and the erase request signal ER of the inactive low voltage level allows all of the p-channel enhancement type switching transistors Qp13 and Qp15 to turn on. The data signal DT indicative of a key code is applied to the bit line drivers 131 to 13n, and each bit of the data signal DT cause either p-channel enhancement type switching transistor Qp12 or Qp14 to turn on depending on the logic level thereof for transferring the positive low voltage level Vd2 to the associated bit line BLa or BLb. However, the other of the p-channel enhancement type switching transistors is kept off, and the associated bit line remains at zero volt.

As described hereinbefore, either floating gate type field effect transistor TM1 or TM2 enters the programmed state in the register mode, and drain current flows into the associated common source line SL as shown in FIG. 4.

Assuming now that the stored data bit is logic "0" level, the floating gate type field effect transistor TM1 is in the programmed state represented by the high threshold, and the other floating gate type field effect transistor TM2 is in the erased state represented by the low threshold. In this situation, the key data bit of logic "0" level does not results in any drain current. However, the key data bit of logic "1" level allows the drain current to flow through the floating gate type field effect transistor TM2 to the associated source line SL.

On the other hand, if the stored data bit is logic "1" level, the floating gate type field effect transistor TM1 is in the erased state, and the floating gate type field effect transistor TM2 is in the programmed state. Then, the key data bit of logic "1" level does not allows any drain current to flow through both floating gate type field effect transistors TM1 and TM2. However, the drain current flows through the floating gate type field effect transistor TM1 in the presence of the key data bit of logic "0" level. Thus, if the stored data bit is identical in logic level with the key data bit, any drain current does not flow. However, either floating gate type field effect transistor TM1 or TM2 allows the drain current to flow into the associated common source line SL in case of inconsistence.

Turning back to FIG. 2 of the drawings, all of the source line driving circuits 14 are similar in circuit arrangement to one another, and each of the source line driving circuits 14 comprises a p-channel enhancement type switching transistor Qp16 coupled between a power voltage line VL2 and the associated common source line SL, an n-channel enhancement type switching transistor Qn17 coupled between the associated common source line SL and the power voltage line VL2, an inverter IVx and an n-channel enhancement type switching transistor Qn18 coupled with the associated common source line SL. The power voltage line VL2 supplies the extremely high voltage level Vpp to the p-channel enhancement type switching transistor Qp16. The erase request signal ER is supplied to the inverter IVx which in turn supplies the erase request signal ER to the gate electrode of the p-channel enhancement type switching transistor Qp16 and to the gate electrode of the n-channel enhancement type switching transistor Qn18. The write enable signal WE is directly supplied to the n-channel enhancement type switching transistor Qn17.

While the associative memory device is in the erasing mode, the inverter IVx produces the complementary erase request signal of the low voltage level from the erase request signal ER of the active high voltage level, and the complementary erase request signal causes the p-channel enhancement type switching transistor Qp16 to supply the extremely high voltage level Vpp to the associated common source line SL. However, the n-channel enhancement type switching transistor Qn18 turns off with the complementary erase request signal, and prevents the associated monitor circuit 15 from the extremely high voltage level Vpp.

In the register and retrieval modes, the erase request signal ER goes down to the inactive low voltage level, and, accordingly, the complementary erase request signal goes up to the high voltage level. As a result, the p-channel enhancement type switching transistor Qp16 turns off, and the associated common source line SL is cut off from the extremely high voltage level Vpp. The write enable signal WE goes up to the active high voltage level in the register mode, and the n-channel enhancement type switching transistor Qn17 supplies the ground voltage level to the associated common source line SL. However, if the associative memory device enters the retrieval mode, the write enable signal WE goes down to the inactive low voltage level, and the complementary erase request signal of the high voltage level allows the n-channel enhancement type switching transistor Qn18 to turn on for coupling the associated common source line SL with the associated monitor circuit 15.

All of the monitor circuits 15 are similar in circuit arrangement to one another, and each of the monitor circuits 15 has a current mirror configuration, and comprises an n-channel enhancement type variable load transistor Qn19 coupled between the drain node of the n-channel enhancement type switching transistor Qn18 and the power voltage line VL1, an n-channel enhancement type variable load transistor Qn20 coupled between an output node Nout and the power voltage line VL1, and an n-channel enhancement type load transistor Qn21 coupled between a power voltage line and the output node Nout. The gate electrodes of the n-channel enhancement type variable load transistors Qn19 and Qn20 are coupled with the drain node of the n-channel enhancement type switching transistor Qn18, and the power voltage line VL3 supplies a positive power voltage level Vcc between the extremely high voltage level Vpp and the ground voltage level to the output node Nout.

While any drain current flows in the retrieval mode, the n-channel enhancement type variable load transistors Qn19 and Qn20 turn off, and the output node Nout is kept at the positive power voltage level Vcc indicative of the consistence between the selected data code and the key code. However, if the drain current flows into the associated common source line SL in the retrieval mode, the associated common source line SL goes up over the threshold level of the n-channel enhancement type variable load transistors Qn19 and Qn20, and the n-channel enhancement type variable load transistors Qn19 and Qn20 turn on. Then, the output node Nout is decayed to a low voltage level, and the low voltage level is indicative of the inconsistence between the selected data code and the key code.

Description is hereinbelow made on the three modes of operation on the assumption that each the data code and the key code consists of bits of logic "1" level. In the following description, the word line selecting signal WS is assumed to make the row of memory cells M11 to M1n accessible in the register and retrieval modes.

First, if the erase request signal ER and the word line driving signal WS go up to the high voltage level, the associative memory device enters the erasing mode. With the word line selecting signal WS of the high voltage level, all of the word lines WL1 to WLm are grounded through the word line drivers 121 to 12m, and the ground voltage level is applied to the control gates of all the floating gate type field effect transistors TM1 and TM2. The erase request signal ER of the active high voltage level causes the p-channel enhancement type switching transistors Qp13 and Qp15 of all the bit line drivers 131 to 13n to turn off, and all of the bit line pairs BL1 to BLn enter the open-state. The inverter IVx supplies the complementary erase request signal of the low voltage level to the gate electrode of the p-channel enhancement type switching transistor Qp16, and the p-channel enhancement type switching transistor Qp16 transfers the extremely high voltage Vpp to the associated common source line SL. Then, electrons are evacuated from the floating gate electrodes F of all the floating gate type field effect transistors TM1 and TM2 to the associated common source line SL, and the floating gate type field effect transistors TM1 an TM2 enter the erased state with the low threshold. The erasing operation may be repeated until the thresholds are regulated to an appropriate value.

If the mode control signal MD is indicative of the register mode, the voltage controller 12a supplies the extremely high voltage level Vpp through the word line driver 121 to the word line WL1, and logic "1" bits of the data code cause the inverters IV1 to IVn to switch the p-channel enhancement type switching transistors Qp14 of the bit line drivers 131 to 13n on. The erase request signal ER of the inactive low voltage level switches the p-channel enhancement type switching transistors Qp13 and Qp15 on, and the voltage controller 13a supplies the positive high voltage level Vd1 to the second bit lines of all the bit line pairs BL1 to BLn. The write enable signal WE of the active high voltage level causes the n-channel enhancement type switching transistor Qn17 to turn on, and the ground voltage is supplied to the associated common source line SL. Then, hot electrons are produced in the vicinity of the drains of the floating gate type field effect transistors TM2 of the memory cells M11 to M1n, and are attracted to the floating gate electrodes. As a result, floating gate type field effect transistors TM2 of the memory cells M11 to M1n enter the programmed state, and the threshold level thereof is increased over 5 volts. However, the floating gate type field effect transistors TM1 of the memory cells M11 to M1n are left in the erased state. The data code consisting of logic "1" bits is stored in the row of memory cells M11 to M1n.

If the mode control signal MD is indicative of the retrieval mode, the voltage controller 12a supplies the positive voltage level Vcc at 5 volts through the word line driver 121 to the word line WL1. The logic "1" bits of the key code cause the inverters IV1 to IVn to switch the p-channel enhancement type switching transistors Qp14 of the bit line drivers 131 to 13n on, and the voltage controller 13a supplies the positive low voltage level Vd2 at 1 volt to the second bit lines BLb of the bit line pairs BL1 to BLn. However, the p-channel enhancement type switching transistors Qp12 are turned off, and cut off the first bit lines BLa from the positive low voltage level Vd2. The complementary erase request signal ER of the high voltage level causes the n-channel enhancement type switching transistor Qn18 to turn on, and the associated common source line SL is coupled with the associated monitoring circuit 15.

The floating gate type field effect transistors TM2 of the memory cells M11 to M1n have been already entered the programmed state, and have the high threshold. For this reason, any conductive channel takes place in the floating gate type field effect transistors TM2 of the memory cells M11 to M1n. In other words, any drain current flows into the associated common source line SL through the floating gate type field effect transistors TM2. Although the floating gate type field effect transistors TM1 of the memory cells M11 to M1n are in the erased state, any current is supplied to the first bit lines BLa, and any drain current flows through the floating gate type field effect transistors TM1 of the memory cells M11 to M1n into the associated common source line SL. As a result, the voltage level on the associated common source line SL does not exceed the threshold level of the n-channel enhancement type variable load transistors Qn19 and Qn20, and the n-channel enhancement type variable load transistors Qn19 and Qn20 are turned off. The n-channel enhancement type load transistor Qn21 supplies the positive power voltage level Vcc, and the output signal Dout is indicative of the consistence between the data code and the key code.

As will be understood from the foregoing description, each of the associative memory cell M11 to Mmn is implemented by only two floating gate type field effect transistors TM1 and TM2, and occupies a relatively small amount of real estate on the semiconductor chip 10. Therefore, the integration density of the memory cell array 11 is drastically increased rather than the prior art associative memory cell array.

Moreover, even through the associative memory device according to the present invention is switched off, the data codes are not volatile in the memory cell array 11. If the associative memory device according to the present invention is applied to an electronic dictionary, the data retrieval system incorporated therein is scaled down, and variable-length data codes are stored in and retrieved from the memory cell array 11. For example, the memory cell array 11 is assumed to be implemented by a 16 megabit flash EEPROMs, and a word is averaged at 4 characters each represented by sixteen bits. The associative memory device according to the present invention can store 120,000 words on a single semiconductor chip.

Second Embodiment

Figure 5:
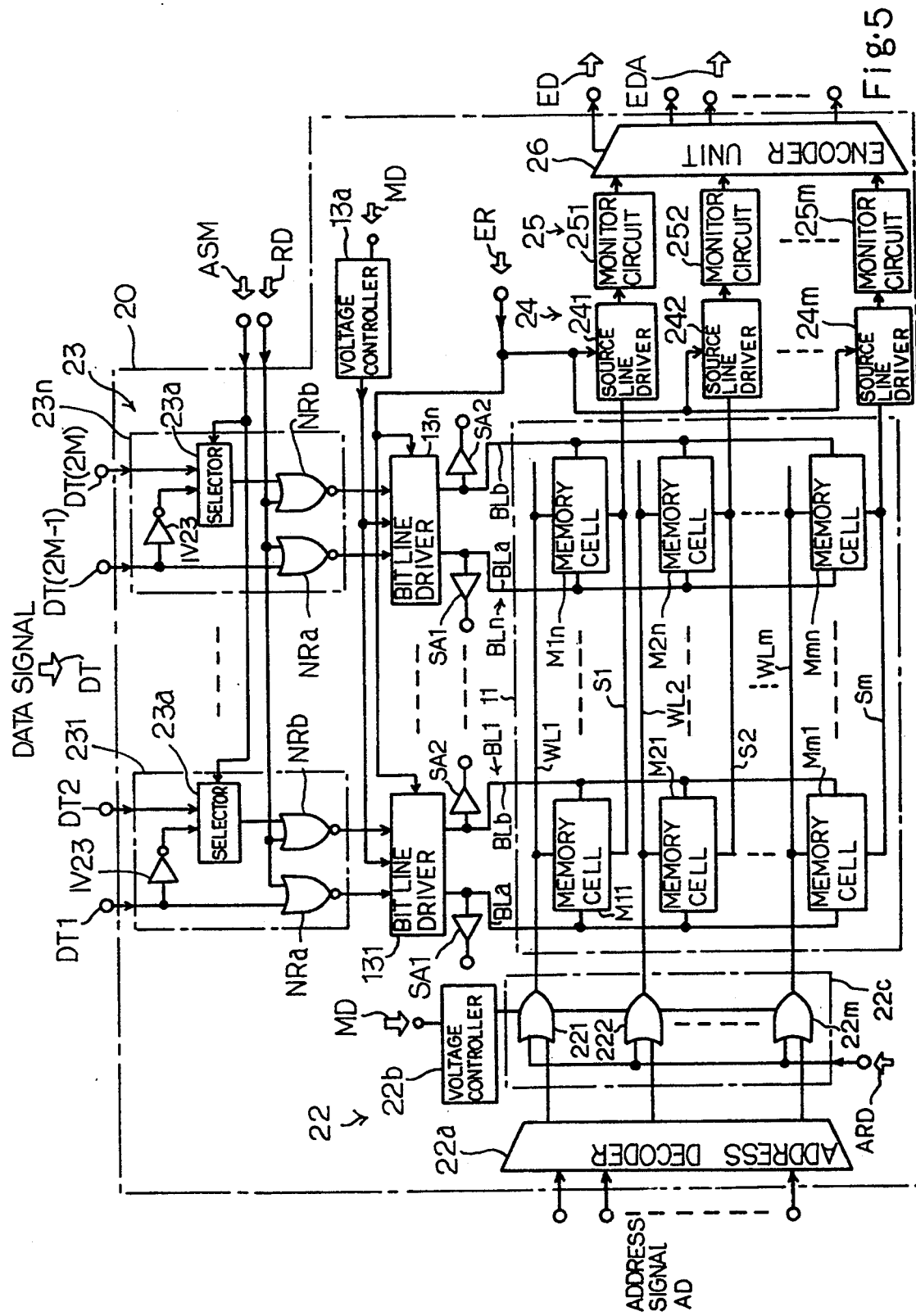
FIG. 5 is a circuit diagram showing the arrangement of another associative memory device according to the present invention.

Turning to FIG. 5 of the drawings, another associative memory device embodying the present invention is fabricated on a single semiconductor chip 20. The associative memory device implementing the second embodimemnt has the memeory cell array 11, the word lines WL1 to WLm, the bit line pairs BL1 to BLn, the voltage controller 13a and the bit line drivers 131 to 13n of the first embodiemnt are incorporated int the associative memory device as shown in FIG. 5 . The associative memory device impleemnting the second embodiemnt serves not only as the assoicative memory similar to the first embodiemnt but also as an ordinary electricaly erasable and programmable memory, and further has a programming mode and a read-out mode. In order to address the memory cells M11 to Mmn in the programming and the read-out modes, a word line driving unit 22 and a bit line driving unit 23 are modified, and a plurality pairs of sense amplifiers SA1 and SAn are further incorporated. The register mode and the retrieval mode are hereinbelow referred to as an associative phase, and the programming mode and the read-out mode are called as an ordinary phase.

The word line driving unit 22 comprises an address decoder 22a, a voltage controller 22b and a word line driver 22c. An address signal AD is supplied to the address decoder 32a, and address decoded signals are supplied from the address decoder 32a to the word line driver 32c. The word line driver 32c is impleemented by an array of OR gates 321 to 32m, and the OR gates 321 to 32m are powered by the voltage controller 32b. The voltage controller 32b is similar to the voltage controller 12a, and is responsive to the mode control signal MD for selectively supplying the extremely high voltage level Vpp at 12 volts and the positive high voltage levle Vcc at 5 volts to the OR gates 321 to 32m. In the retrieval mode, a simultaneous addressing signal ARD of the active high voltage levle is supplied to all of the OR gates 221 to 22m, and the OR gates 221 to 22m drive all of the word lines WL1 to WLm to the positive high voltage level Vcc. However, while the simultaneous addressing signal ARD remains in the inactive low voltage level, the OR gates 221 are responsive to the address decoded signals, and the word lines WL1 to WLm are selectively driven to the positive high voltage level Vcc. Thus, the word line driver circuit 22c drives one of the word lines WL1 to WLm in the ordinary phase, and simultaneously drives all of the word lines WL1 to WLm in the associative phase.

The bit line driving unit 23 further comprises a plurality of data selecting circuits 231 to 23n respectivley associated with the bit line drivers 131 to 13n, and a plurality pairs of data pins DT1/ DT2 . . . and DT(2M-1)/ DT2M are coupled with the data selecting circuits 231 to 23n. Each of the data selecting circuits 231 to 23n comprises an inverter IV23 coupled with one of the data pins DT1, . . . or DT(2M-1), a selector 23a responsive to a phase control signal ASM indicative of the associative phase or the ordinary phase for selecting one of the inverter IV23 and the other data pin DT2 . . . or DT(2M), and two NOR gates NRa and NRb responsive to a read-out control signal RD for simultaneously or selectively supplying the positive low voltage level Vd2 to the firt and second bit lines BLa and BLb of the associated bit line pair.

While the associative memory device is in the ordinary phase, the phase control signal ASM is in the low voltage level or logic "0" level, and the data signal DT indicative of a 2M-bit write-in data code is supplied to the data pins DT1, . . . and DT(2M). The selectors 23a is transparent to the data bits at the data pins DT2 . . . and DT(2M) in the presence of the phase control signal of logic "0" level, and the 2M-bit write-in data code is supplied from the data bits DT1 to DT(2M-1) to the NOR gates NRa and from the data pins DT2 to DT(2M) through the selectors 23a to the NOR gates NRb. In the programming mode, the read control signal RD remains in the low voltage level or logic "0" level, and the NOR gates NRa and NRb are enabled with the read control signal RD. The NOR gates NRa and NRb allows the p-channel enhancement type switching transistors Qp12 and Qp14 to selectively turn on and off depending upon the logic level of the data bits, and the positive high voltage level Vd1 at 6 volts is selectively supplied to the first and second bit lines BLa and BLb. The word line driving circuit 22c drives one of the word lines WL1 to WLm to the extremely high voltage level Vpp, and the floating gate type field effect transistors TM1 and TM2 coupled with the selected word line selectively enter the programmed state.

On the other hand, the read control signal RD of the high voltage level or logic "1" level allows all of the NOR gates NRa and NRb to supply the positive high voltage level to the p-channel enhancement type switching transistors Qp12 and Qp14 in the read-out mode, and the p-channel enhancement type switching transistors Qp12 and Qp14 turn on so that the positive low voltage level Vd2 at 1 volt is supplied to all of the floating gate type field effect transistors TM1 and TM2. The floating gate type field effect transistors TM1 and TM2 in the erased state discharges current to the associated source lines S1 to Sm, and the voltage level on the associated bit lines BLa and BLb are decayed. On the other hand, the floating gate type field effect transistors TM1 and TM2 in the programmed state keep the voltage level on the associated bit lines BLa and BLb. The voltage levels on all the bit lines BLa and BLb are detected by the associated sense amplifiers SA1 and SA2, and a 2M-bit read-out data signal is output from a data output port (not shown) to a destination.

While the associative memory device is in the associative phase, the phase control signal ASM remains in the high voltage level or logic "1" level, and the selectors 23a become transparent to the complementary data bits from the inverters IV23. In the associative phase, an M-bit data signal is applied to the data pins DT1, . . . and DT(2M-1), and the inverters IV23 produces the complementary data bits from the M-bit data signal. The read control signal RD enables the NOR gates NRa and NRb, and the data bits at the data pins DT1 ... and DT(2M-1) and the complementary data bits are supplied to the NOR gates NRa and NRb. The NOR gates NRa and NRb complementarily switch the p-channel enhancement type switching transistors Qp12 and the p-channel enhancement type switching transistors Qp14, and the positive high voltage level Vd1 or the positive low voltage level Vd2 is selectively supplied to the first and second bit lines of the bit line pairs BL1 to BLn depending upon the mode of operation.

In the register mode, one of the OR gates 221 to 22m drives the associated word line, and either floating gate type field effect transistor TM1 or TM2 of each memory cell enters the programmed state depending upon the logic level of one of the data bits of the M-bit data signal.

However, the simultaneous addressing signal ARD goes up to the active high voltage level in the retrieval mode, and causes all of the OR gates 221 to 22m to drive the associated word lines WL1 to WLm. Therefore, the M-bit data signal indicative of a key code is simultaneously compared with the data codes stored in the respective rows of memory cells.

In detail, a source line system of the second embodiment is implemented by a plurality of source lines S1 to Sm, and, accordingly, a source line driver unit 24 and a monitoring unit 25 are respectively constituted by a plurality of source line driver circuits 241 to 24m and a plurality of monitoring circuits 251 to 25m. The source line drivers 241 to 24m and the monitor circuits 251 to 25m are similar to the source line driving unit 14 and the associated monitoring unit 15, respectively. However, the source line drivers 241 to 24m further supply the ground voltage level to the associated source lines S1 to Sm in the programming and read-out modes. The monitor circuits 251 to 25m are coupled with an encoder unit 26, and the encoder unit behaves as follows.

If one of the data codes is consistent with the key code, any drain current does not flow into the associated source line, and the encoder unit 26 produces a consistent signal ED and an address signal EDA indicative of the address assigned to the row of memory cells storing the consistent data code. However, if all of the data codes are inconsistent with the key code, the encoder unit 26 does not produce the consistent signal ED.

Thus, the associative memory device implementing the second embodiment serves as the associative memory for M-bit data codes and the ordinary electrically erasable and programmable read only memory for 2M-bit data codes.

Although particular embodiments of the present invention have been shown and described, it will be obvious to those skilled in the art that various changes and modifications may be made without departing from the spirit and scope of the present invention. For example, an associative memory device according to the present invention may be integral with other function blocks on a single semiconductor chip.

What is claimed is:

1. An associative memory device selectively entering an erasing mode, a register mode and a retrieval mode of operation, comprising:

a) a plurality of memory cells arranged in rows and columns, and each comprising only two transistors: a first electrically erasable and programmable non-volatile memory transistor and a second electrically erasable and programmable non-volatile memory transistor arranged in parallel, said first and second electrically erasable and programmable non-volatile memory transistors entering an erased state with one of high and low thresholds and a programmed state with the other of said high and low thresholds;

b) a plurality of word lines respectively associated with the rows of memory cells, and each coupled with control gate electrodes of said first and second electrically erasable and programmable non-volatile memory transistors of the associated row;

c) a word line driving unit coupled with said plurality of word lines, and selectively driving said plurality of word lines to a first programming level in said register mode, to a first erasing level in said erasing mode and to a first read-out level in said retrieval mode;

d) a plurality of bit line pairs each consisting of a first bit line and a second bit line, and respectively associated with the columns of memory cells, said first bit line of each bit line pair being coupled with drain nodes of said first electrically erasable and programmable non-volatile memory transistors of the associated column, said second bit line of each bit line pair being coupled with drain nodes of said second electrically erasable and programmable non-volatile memory transistors of the associated column;

e) a bit line driving unit responsive to a multi-bit data signal indicative of a data code in said register mode and of a key code in said retrieval mode, and operative to selectively drive said first and second bit lines of said plurality of bit line pairs to a second programming level depending upon the logic level of bits of said data code in said register mode and to a second read-out level depending upon the logic level of bits of said key code in said retrieval mode, said bit line driving unit further being operative to allow said plurality of bit line pairs to enter open-state in said erasing mode;

f) a source line system coupled with source nodes of said first and second electrically erasable and programmable non-volatile memory transistors of said plurality of memory cells;

g) a source line driving unit coupled with said source line system for supplying a third programming level in said register mode, a third erasing level in said erasing mode and a third read-out level in said retrieval mode to said source line system, said word line driving unit cooperating with said bit line driving unit and said source line driving unit for causing one of said first and second electrically erasable and programmable non-volatile memory transistors of each memory cell in one of said rows selected by said word line driving unit to enter said programmed state depending upon the logic level of one of the bits of said data code in said register mode, said word line driving unit further cooperating with said bit line driving unit and said source line driving unit for checking said memory cells of one of said rows selected by said word line driving unit to see whether or not said first and second electrically erasable and programmable non-volatile memory cells thereof allow drain current to flow into said source line system; and h) a monitoring unit for monitoring said source line system to see whether or not said drain current flows, said drain current being indicative of one of consistence and inconsistence between said data code and said key code.

2. An associative memory device as set forth in claim 1, in which said source line system is implemented by a single source line coupled with said source line driving unit as well as with said monitoring unit.

3. An associative memory device as set forth in claim 1, in which said word line driving unit comprises a first voltage controller responsive to a mode control signal for producing one of said first programming level and said first read-out level, and a plurality of word line drivers coupled between said first voltage controller and said plurality of word lines and responsive to a multi-bit word line selecting signal for selectively supplying said first programming level in said register mode, said first erasing level in said erasing mode and said first read-out level in said retrieval mode.

4. An associative memory device as set forth in claim 3, in which said bit line driving unit comprises a plurality of first inverters for producing a complementary data signal from said data signal, a second voltage controller responsive to said mode control signal for selectively producing said second programming level and said second read-out level, and a plurality of bit line drivers coupled between said second voltage controller and said plurality of bit line pairs and responsive to said data signal, said complementary data signal and an erase request signal for selectively supplying said second programming level in said register mode and said second read-out level in said retrieval mode or for isolating said plurality of bit line pairs from said second voltage controller in said erasing mode.

5. An associative memory device as set forth in claim 1, in which said source line system, said source line driving unit and said monitoring unit have a plurality of source lines respectively associated with said rows of memory cells, a plurality of source line drivers respectively coupled with said plurality of source lines and a plurality of monitoring circuits respectively connectable with said plurality of source lines, respectively, said word line driving unit driving all of said plurality of word lines to said first read-out level in said retrieval mode.

6. An associative memory device selectively entering an erasing mode, a register mode and a retrieval mode of operation, comprising:

a) a plurality of memory cells arranged in rows and columns, and each having a first electrically erasable and programmable non-volatile memory transistor and a second electrically erasable and programmable non-volatile memory transistor arranged in parallel, said first and second electrically erasable and programmable non-volatile memory transistors entering an erased state with one of high and low thresholds and a programmed state with the other of said high and low thresholds;

b) a plurality of word lines respectively associated with the rows of memory cells, and each coupled with control gate electrodes of said first and second electrically erasable and programmable non-volatile memory transistors of the associated row;

c) a word line driving unit coupled with said plurality of word lines, and selectively driving said plurality of word lines to a first programming level in said register mode, to a first erasing level in said erasing mode and to a first read-out level in said retrieval mode, said word line driving unit comprising:

a first voltage controller responsive to a mode control signal for producing one of said first programming level and said first read-out level, and a plurality of word line drivers coupled between said first voltage controller and said plurality of word lines and responsive to a multi-bit word line selecting signal for selectively supplying said first programming level in said register mode, said first erasing level in said erasing mode and said first read-out level in said retrieval mode;

d) a plurality of bit line pairs each consisting of a first bit line and a second bit line, and respectively associated with the columns of memory cells, said first bit line of each bit line pair being coupled with drain nodes of said first electrically erasable and programmable non-volatile memory transistors of the associated column, said second bit line of each bit line pair being coupled with drain nodes of said second electrically erasable and programmable non-volatile memory transistors of the associated column;

e) a bit line driving unit responsive to a multi-bit data signal indicative of a data code in said register mode and of a key code in said retrieval mode, and operative to selectively drive said first and second bit lines of said plurality of bit line pairs to a second programming level depending upon the logic level of bits of said data code in said register mode and to a second read-out level depending upon the logic level of bits of said key code in said retrieval mode, said bit line driving unit further being operative to allow said plurality of bit line pairs to enter open-state in said erasing mode, bit line driving unit comprising:

a plurality of first inverters for producing a complementary data signal from said data signal, a second voltage controller responsive to said mode control signal for selectively producing said second programming level and said second read-out level, and a plurality of bit line drivers coupled between said second voltage controller and said plurality of bit line pairs and responsive to said data signal, said complementary data signal and an erase request signal for selectively supplying said second programming level in said register mode and said second read-out level in said retrieval mode or for isolating said plurality of bit line pairs from said second voltage controller in said erasing mode, each of said bit line drivers comprising a first switching transistor coupled with said second voltage controller and gated by one of the bits of said data signal, a second switching transistor coupled with said second voltage controller and gated by one of the bits of said complementary data signal, a third switching transistor coupled between said first switching transistor and said first bit line of an associated one of said bit line pairs and responsive to said erase request signal, and a fourth switching transistor coupled between said second switching transistor and said second bit line of said associated one of said bit line pairs and responsive to said erase request signal;

f) a source line system coupled with source nodes of said first and second electrically erasable and programmable non-volatile memory transistors of said plurality of memory cells;

g) a source line driving unit coupled with said source line system for supplying a third programing level in said register mode, a third erasing level in said erasing mode and a third read-out level in said retrieval mode to said source line system, said word line driving unit cooperating with said bit line driving unit and said source line driving unit for causing one of said first and second electrically erasable and programmable non-volatile memory transistors of each memory cell in one of said rows selected by said word line driving unit to enter said programmed state depending upon the logic level of one of the bits of said data code in said register mode, said word line driving unit further cooperating with said bit line driving unit and said source line driving unit for checking said memory cells of one of said rows selected by said word line driving unit to see whether or not said first and second electrically erasable and programmable non-volatile memory cells thereof allow drain current to flow into said source line system; and h) a monitoring unit for monitoring said source line system to see whether or not said drain current flows, said drain current being indicative of one of consistence and inconsistence between said data code and said key code.

7. An associative memory device as set forth in claim 5, in which said source line driving unit comprises a second inverter for producing a complementary erase request signal from said erase request signal, a fifth switching transistor coupled between a source of said third erasing level and said source line system and responsive to said complementary erase request signal for supplying said third erasing level to said source line system in said erasing mode, a sixth switching transistor coupled between said source line system and a source of said first programming level and responsive to a write enable signal for supplying said third programming level to said source line system in said register mode, and a seventh switching transistor responsive to said complementary erase request signal for coupling said source line system with said monitoring unit in said retrieval mode.

8. An associative memory device as set forth in claim 7, in which said monitoring unit comprises a first variable load transistor coupled between said seventh switching transistor and a first power voltage line and having a gate electrode coupled with a drain node thereof, a second variable load transistor coupled between an output port and said first power voltage line and having a gate electrode coupled with said drain node of said first variable load transistor, and a load transistor coupled between a second power voltage line and said output port and having a gate electrode coupled with said second power voltage line.

9. An associative memory device selectively entering an erasing mode, a register mode and a retrieval mode of operation, comprising:

a) a plurality of memory cells arranged in rows and columns, and each having a first electrically erasable and programmable non-volatile memory transistor and a second electrically erasable and programmable non-volatile memory transistor arranged in parallel, said first and second electrically erasable and programmable non-volatile memory transistors entering an erased state with one of high and low thresholds and a programmed state with the other of said high and low thresholds;

b) a plurality of word lines respectively associated with the rows of memory cells, and each coupled with control gate electrodes of said first and second electrically erasable and programmable non-volatile memory transistors of the associated row;

c) a word line driving unit coupled with said plurality of word lines, and selectively driving said plurality of word lines to a first programming level in said register mode, to a first erasing level in said erasing mode and to a first read-out level in said retrieval mode;

d) a plurality of bit line pairs each consisting of a first bit line and a second bit line, and respectively associated with the columns of memory cells, said first bit line of each bit line pair being coupled with drain nodes of said first electrically erasable and programmable non-volatile memory transistors of the associated column, said second bit line of each bit line pair being coupled with drain nodes of said second electrically erasable and programmable non-volatile memory transistors of the associated column;

e) a bit line driving unit responsive to a multi-bit data signal indicative of a data code in said register mode and of a key code in said retrieval mode, and operative to selectively drive said first and second bit lines of said plurality of bit line pairs to a second programming level depending upon the logic level of bits of said data code in said register mode and to a second read-out level depending upon the logic level of bits of said key code in said retrieval mode, said bit line driving unit further being operative to allow said plurality of bit line pairs to enter open-state in said erasing mode;

f) a source line system coupled with source nodes of said first and second electrically erasable and programmable non-volatile memory transistors of said plurality of memory cells;

g) a source line driving unit coupled with said source line system for supplying a third programming level in said register mode, a third erasing level in said erasing mode and a third read-out level in said retrieval mode to said source line system, said word line driving unit cooperating with said bit line driving unit and said source line driving unit for causing one of said first and second electrically erasable and programmable non-volatile memory transistors of each memory cell in one of said rows selected by said word line driving unit to enter said programmed state depending upon the logic level of one of the bits of said data code in said register mode, said word line driving unit further cooperating with said bit line driving unit and said source line driving unit for checking said memory cells of one of said rows selected by said word line driving unit to see whether or not said first and second electrically erasable and programmable non-volatile memory cells thereof allow drain current to flow into said source line system; and h) a monitoring unit for monitoring said source line system to see whether or not said drain current flows, said drain current being indicative of one of consistence and inconsistence between said data code and said key code said source line system, said source line driving unit and said monitoring unit having a plurality of source lines respectively associated with said rows of memory cells, a plurality of source line drivers respectively coupled with said plurality of source lines and a plurality of monitoring circuits respectively connectable with said plurality of source lines, respectively, said word line driving unit driving all of said plurality of word lines to said first read-out level in said retrieval mode, said plurality of monitoring circuits being coupled with an encoder unit for producing a consistent signal indicative of a data code stored in one of said rows of memory cells and matched with said key code as well as an address signal indicative of the address assigned to said one of said rows of memory cells.

10. An associative memory device as set forth in claim 9, in which said associative memory device further has a programming mode and a read-out mode, said bit line driving unit comprising a plurality of data selecting circuits responsive to a phase control signal for transferring said data signal indicative of a write-in data code in said programming mode, said data signal indicative of said data code and a complementary data signal thereof in said register mode and said data code indicative of said key code and a complementary data signal thereof in said retrieval mode, a voltage controller responsive to a mode control signal for selectively producing said second programming level and said second read-out level, and a plurality of bit line drivers coupled between said voltage controller and said plurality of bit line pairs and responsive to said data signal, said complementary data signal and an erase request signal for selectively supplying said second programming level in said register and programming modes and said second read-out level in said retrieval and read-out modes or for isolating said plurality of bit line pairs from said voltage controller in said erasing mode.

11. An associative memory device as set forth in claim 10, in which said data signal is supplied to a plurality pairs of data pins respectively associated with said plurality of data selecting circuits, each of said plurality of data selecting circuits comprising an inverter coupled with one of the data pins of the associated pair, a selector responsive to said phase control signal for coupling one of said inverter and the other of the data pins of said associated pair with an output node thereof, a first NOR gate coupled between said one of said data pins and said first bit line of the associated bit line pair and disabled with a read control signal indicative of said read-out mode, and a second NOR gate coupled between the output node of said selector and said second bit line of the associated bit line pair and disabled with said read control signal.

* * * * *

UNITED STATES PATENT AND TRADEMARK OFFICE
CERTIFICATE OF CORRECTION

PATENT NO. : 5,371,697

DATED : December 6, 1994

INVENTOR(S) : Hachiro Yamada

It is certified that error appears in the above-identified patent and that said Letters Patent is hereby corrected as shown below:

Column 1, line 56, delete "QnS, and insert --Qn8--;

Column 4, line 40, delete "Dour", and insert --Dout--;

Column 6, line 45, delete "I", and insert --1--;

Column 7, line 33, delete "an", and insert --and--;

Column 9, line 59, delete "an", and insert --and--;

Column 11, line 26, delete "embodiemnt", and insert --embodiment--;

Column 11, line 26, delete "int", and insert --into--;

Column 11, line 28, delete "impleemnting", and insert --implementing--;

Column 11, lines 28 and 29, delete "embodiemnt", and insert --embodiment--;

Column 11, line 29, delete "assoicative", and insert --associative--;

Column 11, line 30, delete "embodiemnt", and insert --embodiment--;

Column 11, line 46, delete "impleemented", and insert --implemented--;

UNITED STATES PATENT AND TRADEMARK OFFICE
CERTIFICATE OF CORRECTION

PATENT NO.　：　5,371,697

DATED　　　：　December 6, 1994

INVENTOR(S)：　Hachiro Yamada

It is certified that error appears in the above-identified patent and that said Letters Patent is hereby corrected as shown below:

Column 11, line 53, delete "levle", and insert --level--;

Column 11, line 55, delete "levle", and insert --level--;

Column 11, line 68, delete "respectivley", and insert --respectively--;

Column 12, line 13, delete "firt", and insert --first--.

Signed and Sealed this

Eighth Day of August, 1995

Attest:

BRUCE LEHMAN

*Attesting Officer*　　　*Commissioner of Patents and Trademarks*